(12) United States Patent
Zhao et al.

(10) Patent No.: US 9,567,689 B2
(45) Date of Patent: Feb. 14, 2017

(54) METHOD OF GROWING NANOSTRUCTURED SINGLE CRYSTAL SILVER ON ACTIVE CARBON

(71) Applicants: Shanghai Jiao Tong University, Shanghai (CN); Shanghai Switchdiy Digital Technology Co., Ltd., Shanghai (CN)

(72) Inventors: Binyuan Zhao, Shanghai (CN); Hong Zhao, Shanghai (CN); Fei Wang, Shanghai (CN); Yijian Lai, Shanghai (CN); Yuesheng Ning, Shanghai (CN); Lei Wang, Shanghai (CN); Jie Zhou, Shanghai (CN)

(73) Assignees: SHANGHAI JIAO TONG UNIVERSITY, Minhang District, Shanghai (CN); SHANGHAI SWITCHDIY DIGITAL TECHNOLOGY CO., LTD., Songjiang District, Shanghai (CN)

( * ) Notice: Subject to any disclaimer, the term of this patent is extended or adjusted under 35 U.S.C. 154(b) by 574 days.

(21) Appl. No.: 14/078,375

(22) Filed: Nov. 12, 2013

(65) Prior Publication Data

US 2015/0128848 A1    May 14, 2015

(51) Int. Cl.
*C30B 7/14* (2006.01)
*C30B 29/02* (2006.01)

(52) U.S. Cl.
CPC ....... *C30B 7/14* (2013.01); *C30B 29/02* (2013.01)

(58) Field of Classification Search
CPC .............. C30B 7/00; C30B 7/005; C30B 7/02; C30B 7/04; C30B 7/06; C30B 7/14; C30B 29/00; C30B 29/02; C30B 29/60; C30B 29/62; C30B 29/64; C30B 19/00; C30B 19/12; Y10S 977/00; Y10S 977/70; Y10S 977/72; Y10S 977/755; Y10S 977/762; Y10S 977/773; Y10S 977/775; Y10S 977/777; Y10S 977/81
(Continued)

(56) References Cited

PUBLICATIONS

H. Zhao, et al. publication entitled "Green 'planting' nanostructured single crystal silver," Sci. Rep. 3, 1511; DOI:10.1038/srep01511 (2013).*

(Continued)

*Primary Examiner* — Kenneth A Bratland, Jr.
(74) *Attorney, Agent, or Firm* — Global IP Services; Tianhua Gu

(57) ABSTRACT

A method of preparing nanostructured single crystal silver, comprising placing a high-conductive molded porous active carbon containing chloride ions, which has been reductively treated, into a silver-containing precursor solution. After several hours at room temperature, the nanostructured single crystal silver grows on the surface of the active carbon. The silver-containing precursors and appropriate amount of chlorine provide a crystal nucleus and a slow stable crystal growth environment which are required for single crystal silver growth, and said nanostructured silver single crystals could be obtained with various morphologies by controlling the concentration of the silver-containing precursor solution and the growth time. The method of the invention is an environmentally friendly synthesis method with the nanostructured single crystal silver grows on the surface of the molded porous active carbon at room temperature, which is pollution-free and does not need any additives.

5 Claims, 2 Drawing Sheets

(58) Field of Classification Search
USPC .............. 117/11, 54, 56, 58, 63, 68, 70, 921,117/937–938; 977/700, 701, 720, 762, 773, 977/775, 777, 779, 784, 810
See application file for complete search history.

(56) References Cited

PUBLICATIONS

Wang, et al. publication entitled "Tunable growth of nanodendritic silver by galvanic-cell mechanism on formed activated carbon," Chem. Commun., vol. 46, pp. 3782-3784 (2010).*

* cited by examiner

METHOD OF GROWING NANOSTRUCTURED SINGLE CRYSTAL SILVER ON ACTIVE CARBON

BACKGROUND OF THE PRESENT INVENTION

Field of Invention

This invention belongs to the technical field of nanofabrication, in particular, it relates to a method of preparing nanostructured single crystal silver.

Description of Related Arts

Silver nano-materials, particularly single crystals, are becoming current research hotspots for their excellent electrical conductivities, heat transfer performances as well as the unique catalytic and antibacterial properties. Nano-silver materials will have a promising prospect of application in the fields of electronic components, optical fibers, conductive silver pastes, chemical/biological sensors, chemical catalysis, conductive fillers and the like.

Currently, methods of preparing silver nano-materials mainly include ball grinding method, template method, liquid phase reduction method, electrochemical reduction method and so on. The ball grinding method is capable of preparing flaked silver powder, but lots of additives have to be added during ball grinding, and such ball grinding media impurities cannot be completely removed finally and thus the service performance of said flaked silver powder in electronic pastes would be influenced. The template preparation method can provide a high percentage of silver nano-materials, but its application is somewhat limited since the templating agents have to be removed during the preparation and thus the complexity of the process is increased and the yield of the product is lowered. The liquid phase reaction method suffers from the drawbacks such as a high reaction temperature, environmental pollution, complex preparation process, relatively low product purity and sometimes low crystallinity. So this method is not suitable for extension and application.

After retrieval in the prior art documents, it is found that silver nano-particles and silver single crystals are prepared by reduction in situ within the linear chitosan films, see Acta Phys. Chim. Sin., 2003, 19(5):464-468. In this document, spherical silver nano-particles as well as silver single crystals having triangular or hexagonal appearances are prepared within the linear chitosan films by utilizing photoreduction method and electrochemical method, but the silver single crystals are generated with only one morphology and the yield is low. In the existing work of the inventors, a patent of invention CN102418118A has disclosed a method of electrochemical assisted preparation of nano silver powder in special form, the method comprises immersing a working electrode and a counter electrode, which are used as a cathode and an anode respectively, into a silver ion containing solution or collosol to prepare nano silver powder having various morphologies through electrochemical reaction. However, the prepared nano silver are not single crystals and the silver ions are directly reduced into elemental silver without introducing in new seed crystals during reaction.

The existing difficulties are how to stably prepare nanostructured silver single crystals in bulk at low cost and how to solve the silver surface contamination problem resulted from the use of organic additives such as reductants, templating agents and dispersing agents during preparation. The application value of the silver would be improved greatly if the nano silver materials are prepared with controllable nanostructures morphology. It is therefore still desirable to develop a method which is capable of providing nano silver materials with controllable crystallinity and morphology in high yield.

SUMMARY OF THE PRESENT INVENTION

An object of this invention is to provide a preparation method capable of environmentally friendly synthesizing nanostructured single crystal silver in high yield and pollution-free, such that the aforementioned prior art deficiencies could be overcome.

The object of this invention could be achieved by the following technical solutions:

A method of preparing nanostructured single crystal silver, which comprises the following steps:

(1) Reduction treatment of monolithic activated carbon:

Dipping the monolithic activated carbon into a 5-20 wt % aqueous solution of ammonia or absolute ethanol, and after 10 minutes to 2 hours, the monolithic activated carbon is taken out and oven-dried at 60-120° C., to obtain the pre-treated active carbon;

(2) Nanostructured single crystal silver growth on the surface of the monolithic activated carbon:

Preparing a silver-containing precursor solution and dipping the pre-treated active carbon therein, and after a period of time at room temperature, the nanostructured single crystal silver (i.e. the product) grows on the surface of the active carbon with different morphologies.

Said monolithic activated carbon has a good electrical conductivity and water absorption, wherein the electrical conductivity of the active carbon is 200-1000 S/m and the content of the chloride ions is 0.01-1 wt %.

Said silver-containing precursor solution is a silver-ammonia solution at a concentration of 0.0001-0.1 mol/L.

The growth time for the nanostructured single crystal silver in step (2) is from 1 minute to 24 hours.

The structure of the said nanostructured single crystal silver is one or more selected from the group consisting of granular, belt shaped, flake, jagged and fibrous.

The growth mechanism of the nanostructured single crystal silver according to the present invention is as follows: the silver-amino complex ions are ionized into silver ions and hydroxide ions in the silver-ammonia solution of the silver-containing precursors, and said silver ions diffuse onto the active carbon surface to react with the chloride ions of said surface to form silver chloride seed crystals, then the single crystals form primary cells with the reducing groups on the surface of the porous structures of the active carbon via the carbon skeleton so as to obtain electrons and thus being reduced into silver single crystals which continue to serve as anodes and continue to get electrons provided by the electrochemical conversion of the reducing groups on the surface of the porous structures of the active carbon, so that the silver ions are captured from the solution onto the silver single crystals and thus lead to a deposition growth of elemental silver thereon, and hydroxide ions are concentrated onto the cathode to regenerate the reducing groups. A certain concentration of silver ammonia solution precursors and an appropriate amount of chlorine provide a crystal nucleus and a slow stable crystal growth environment which are required for single crystal silver growth.

Compared to the prior art, this invention utilizes the primary cell principle of the molded porous active carbon itself and the reducing functional groups on the surface of the porous structures of the active carbon, and thus the elemental silver can be continuously deposited without the need of any reducing agents, surfactants and external energy.

The advantages of getting nanostructured silver single crystals having different morphologies through modulating the concentration of the silver-containing precursor solution and the growth time are as follows:

1. The method is pollution-free and environmentally friendly, and the nanostructured silver single crystals can grow at room temperature and atmospheric pressure without the need of any additives.
2. The experimental procedures are simple and easy to operate, and the morphology of the nanostructured single crystal silver can be controlled merely by adjusting the concentration of the silver-containing precursor solution and the growth time.
3. The nanostructured single crystal silver can be obtained in high yield and high purity, and can easily be separated from the molded porous active carbon, and furthermore, the porous carbon is renewable through sonication with absolute ethanol or alkaline solution.
4. The product is characterized by having high mechanical strength, superior conductivity and less crystal defects.

DETAILED DESCRIPTION OF THE PREFERRED EMBODIMENTS

The present invention is described in detail below with reference to the accompanying drawings and specific embodiments. The embodiment is carried out based on the technical solution of the present invention. Detailed implementation manners and specific operation processes are provided, but the protection scope of the present invention is not limited to the following embodiments.

Embodiment 1

A 20 wt % ammonia solution was prepared and active carbon was dipped therein for 10 minutes, then the active carbon was taken out and oven-dried at 60° C.; a silver-ammonia solution at a concentration of 0.0001 mol/L was prepared and the pre-treated active carbon was placed therein, and after 1 minutes at room temperature, granular nanostructured single crystal silver grew on the surface of the active carbon. Wherein the conductivity of the active carbon was 200 S/m and chloride ions contained therein was in an amount of 0.01 wt %.

Embodiment 2

Figure 1:
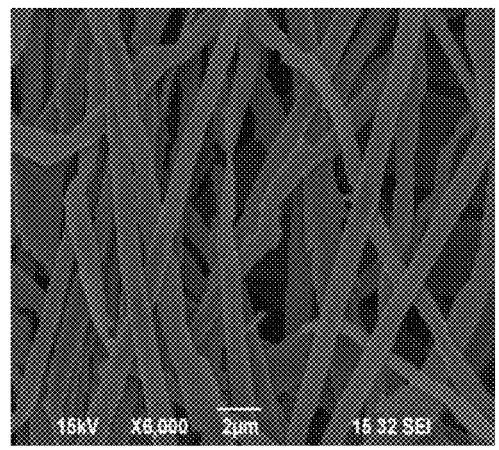
FIG. 1 is a scanning electron microscopy (SEM) photo of the band shaped nano silver single crystals prepared in Example 2.
Figure 3:
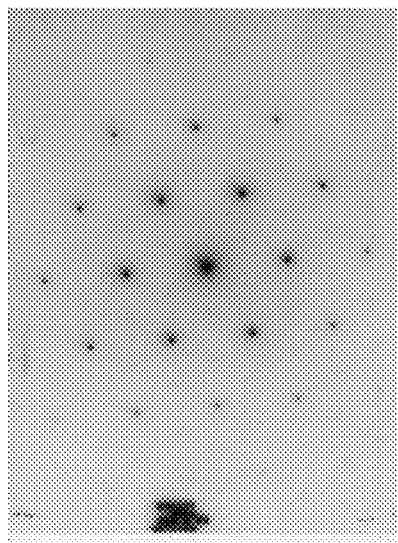
FIG. 3 is a transmission electron microscopy (TEM) diffraction pattern of the band shaped nano silver single crystals prepared in Example 2.

A 5 wt % ammonia solution was prepared and active carbon was dipped therein for 30 minutes, then the active carbon was taken out and over-dried at 80° C.; a silver-ammonia solution at a concentration of 0.005 mol/L was prepared and the pre-treated active carbon was placed therein, and after 1 hour at room temperature, band shaped nanostructured single crystal silver grew on the surface of the active carbon, the SEM photo was shown in FIG. 1, and the TEM diffraction pattern was shown in FIG. 3. Wherein the conductivity of the active carbon was 600 S/m and chloride ions contained therein was in an amount of 0.05 wt %.

Embodiment 3

A 10 wt % ammonia solution was prepared and active carbon was dipped therein for 1 hours, then the active carbon was taken out and over-dried at 100° C.; a silver-ammonia solution at a concentration of 0.01 mol/L was prepared and the pre-treated active carbon was placed therein, and after 40 minutes at room temperature, jagged nanostructured single crystal silver grew on the surface of the active carbon. Wherein the conductivity of the active carbon was 800 S/m and chloride ions contained therein was in an amount of 0.08 wt %.

Embodiment 4

Figure 2:
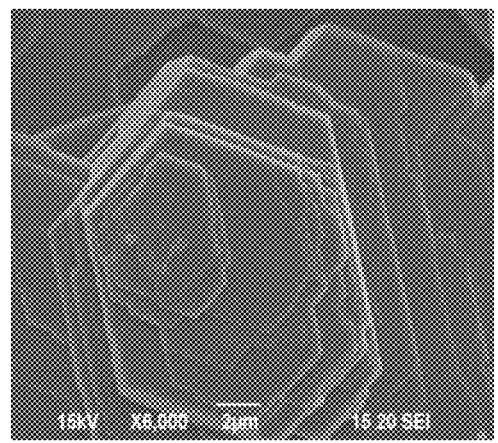
FIG. 2 is a SEM photo of the flake nano silver single crystals prepared in Example 4.
Figure 4:
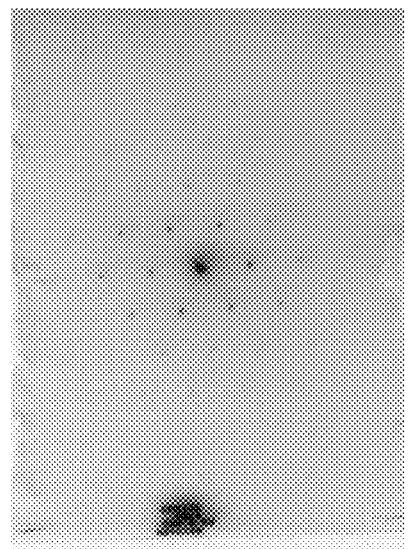
FIG. 4 is a TEM diffraction pattern of the flake nano silver single crystals prepared in Example 4.

A 5 wt % ammonia solution was prepared and active carbon was dipped therein for 1 hour, then the active carbon was taken out and over-dried at 120° C.; a silver-ammonia solution at a concentration of 0.001 mol/L was prepared and the pre-treated active carbon was placed therein, and after 24 hours at room temperature, flake nanostructured single crystal silver grew on the surface of the active carbon, the SEM photo was shown in FIG. 2, and the TEM diffraction pattern was shown in FIG. 4. Wherein the conductivity of the active carbon was 600 S/m and chloride ions contained therein was in an amount of 0.05 wt %.

Embodiment 5

The active carbon was dipped into absolute ethanol for 2 hours and then was taken out and oven-dried at 80° C.; a silver-ammonia solution at a concentration of 0.1 mol/L was prepared and the pre-treated active carbon was placed therein, and after 6 hours at room temperature, fibrous nanostructured single crystal silver grew on the surface of the active carbon. Wherein the conductivity of the active carbon was 950 S/m and the chloride ion content was 0.975 wt %.

Embodiment 6

A method of preparing nanostructured single crystal silver, comprising the steps:

(1) Reduction treatment of monolithic activated carbon: the monolithic activated carbon was dipped into absolute ethanol, and after 10 minutes, the active carbon was taken out and oven-dried at 60° C., thus the pre-treated active carbon was obtained, wherein the monolithic activated carbon had excellent electrical conductivity and water absorption, and wherein the conductivity of the active carbon was 200 S/m and the chloride ion content was 0.01 wt %;

(2) Nanostructured single crystal silver growth on the monolithic activated carbon surface: a silver-ammonia solution at a concentration of 0.0001 mol/L was prepared and the pre-treated active carbon was dipped therein, after remaining at room temperature for 24 hours, granular nanostructured single crystal silver (i.e. the product) grew on the active carbon surface.

Embodiment 7

A method of preparing nanostructured single crystal silver, comprising the steps:

(1) Reduction treatment of monolithic activated carbon: the monolithic activated carbon was dipped into absolute ethanol, and after 2 hours, the active carbon was taken out and oven-dried at 120° C., thus pre-treated active carbon was obtained, wherein the monolithic activated carbon had excellent electrical conductivity and water absorption, and wherein the conductivity of the active carbon was 1000 S/m and the chloride ion content was 1 wt %;

(2) Nanostructured single crystal silver growth on the monolithic activated carbon surface: a silver-ammonia solution at a concentration of 0.1 mol/L was prepared and the pre-treated active carbon was dipped therein, after remaining at room temperature for 1 minute, jagged nanostructured single crystal silver (i.e. the product) grew on the active carbon surface.

What is claimed is:

1. A method for preparing nanostructured single crystal silver comprising following steps:
(1) reduction treatment of monolithic activated carbon: dipping the monolithic activated carbon into a 5-20 wt % of ammonia solution or absolute ethanol, and after 10 minutes to 2 hours, taking the monolithic activated carbon out and oven-drying it at 60-120° C., to obtain pre-treated active carbon;
(2) nanostructured single crystal silver growing on the monolithic activated carbon:
preparing a silver-ammonia solution and dipping the pre-treated active carbon into said silver-ammonia solution, after a period of time at room temperature, nanostructured single crystal silver with different morphologies grow on a surface of the pre-treated active carbon to get nanostructured single crystal silver.

2. The method for preparing nanostructured single crystal silver according to claim 1, characterized in that said monolithic activated carbon has a conductivity of 200-1000 S/m and has a chloride ion content of 0.01-1% wt.

3. The method for preparing nanostructured single crystal silver according to claim 1, characterized in that said silver-ammonia solution has a concentration of 0.0001-0.1 mol/L.

4. The method for preparing nanostructured single crystal silver according to claim 1, characterized in that a growth time of the nanostructured single crystal silver in step (2) is from 1 minute to 24 hours.

5. The method for preparing nanostructured single crystal silver according to claim 1, characterized in that structures of the nanostructured single crystal silver is one or more selected from the group consisting of granular, band shaped, flake, jagged and fibrous.

* * * * *